United States Patent
Jang

(10) Patent No.: US 8,860,167 B2
(45) Date of Patent: Oct. 14, 2014

(54) IMAGE SENSOR AND METHOD FOR MANUFACTURING THE SAME

(75) Inventor: Hoon Jang, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 101 days.

(21) Appl. No.: 13/547,169

(22) Filed: Jul. 12, 2012

(65) Prior Publication Data

US 2013/0032918 A1    Feb. 7, 2013

(30) Foreign Application Priority Data

Aug. 2, 2011    (KR) .......................... 10-2011-0076962

(51) Int. Cl.
*H01L 27/146*    (2006.01)
*H01L 31/18*    (2006.01)

(52) U.S. Cl.
CPC .... *H01L 27/14603* (2013.01); *H01L 27/14607* (2013.01); *H01L 27/1463* (2013.01)
USPC ................... 257/443; 257/440; 257/E27.131; 257/E27.134; 257/E31.052; 438/73

(58) Field of Classification Search
CPC ..................... H01L 27/14603; H01L 27/1463; H01L 27/14607

USPC .................. 257/440, 443, E27.131, E27.134, 257/E31.052

See application file for complete search history.

(56) References Cited

U.S. PATENT DOCUMENTS 6,756,618 B2 *    6/2004    Hong ............................. 257/292
2009/0072337 A1 *    3/2009    Lee ............................... 257/440

FOREIGN PATENT DOCUMENTS

KR    10-2009-0085828    8/2009
KR    1020110079324    7/2011

* cited by examiner

*Primary Examiner* — Matthew W Such
*Assistant Examiner* — David Spalla
(74) *Attorney, Agent, or Firm* — Sherr & Jiang, PLLC

(57) ABSTRACT

An image sensor may include a semiconductor substrate, a plurality of light receiving devices formed within the semiconductor substrate, and a plurality of device isolation films for isolating the light receiving devices from each other. When an arrangement direction of a pixel array may be formed by arranging the light receiving devices is a horizontal direction, the pixel array may be formed by alternately arranging a first type light receiving device and a second type light receiving device having different horizontal lengths.

11 Claims, 7 Drawing Sheets

IMAGE SENSOR AND METHOD FOR MANUFACTURING THE SAME

The present application claims priority to Korean Patent Application No. 10-2011-0076962 (filed on Aug. 2, 2011), which is hereby incorporated by reference in its entirety.

BACKGROUND

Light produced from an object existing in nature may have characteristic values represented in units based on wavelength. An image sensor is an apparatus that may pick up an image of an object by using the properties of a semiconductor device responsive to external energy. A pixel of an image sensor may detect light produced from an object and may convert it into an electrical value.

Such an image sensor may be classified into a charge coupled device (CCD) based on silicon semiconductor and a complementary metal oxide semiconductor (CMOS) image sensor fabricated by a submicron CMOS fabrication technology. Of these image sensors, the CCD is a device in which charge carriers may be stored in a capacitor and transferred under the situation that each MOS capacitor may be relatively closely disposed to each other. However, the CCD may have various disadvantages, such as relatively complicated drive mode, relatively high power consumption, impracticality of integrating a signal processing circuit in a chip for the CCD due to many mask processes and other practical reasons. To overcome these disadvantages, many studies may have been done for the development of CMOS image sensors.

A CMOS image sensor may obtain an image by forming a photodiode (PD) and a MOS transistor within a unit pixel to detect signals in a switching mode. The CMOS image sensor may have advantages of relatively low manufacturing costs and relatively low power consumption and being relatively easily integrated into a peripheral circuit chip compared to a CCD. As mentioned above, since the CMOS image sensor may be produced using a CMOS fabrication technology, the CMOS image sensor may be easily integrated into a peripheral system for performing operations such as amplification and signal processing, resulting in relatively minimized manufacturing costs. Also, the CMOS image sensor has a relatively rapid processing speed and a relatively low power consumption which corresponds to about 1% of power consumption of the CCD.

Due to relatively high demand for image sensors with relatively high resolution, development of CMOS fabrication processes has resulted in minimization of a size of a unit pixel of an image sensor. With the unit pixels minimized in size, a distance between photodiodes of adjacent unit pixels may become closer, which may contribute to a crosstalk occurrence frequency between adjacent pixels.

To lower the crosstalk between the adjacent pixels, methods for maximizing light blocking characteristics of a device isolation film disposed between the unit pixels may be used in the related art.

Figure 1:
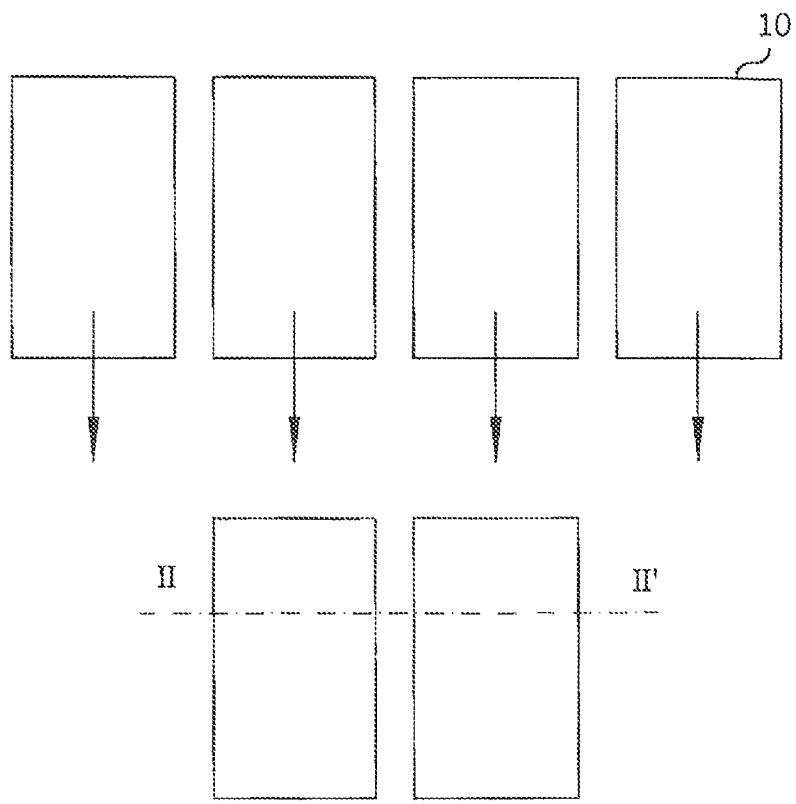
Figure 2:
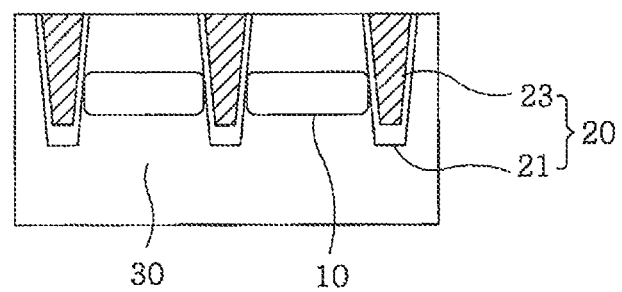

FIG. 1 is an arrangement view showing a pixel array structure of an image sensor, to which a related art method for relatively lowering a crosstalk occurrence frequency may be applied, in accordance with embodiments. FIG. 2 is a cross sectional view taken along the line II-II' of FIG. 1.

According to related art, as shown in FIGS. 1 and 2, a plurality of trenches may be formed on a semiconductor substrate 30 to isolate photodiodes 10 from each other. A plurality of device isolation regions 20 may be formed within the trenches, each of the device isolation regions 20 may be formed by forming a first device isolation film 21 along a trench surface, and then forming a second device isolation film 23 in the first device isolation film 21 to block light incident from adjacent photodiodes 10. The second device isolation film 23 may be formed as an optical absorption film for absorbing incident light from the adjacent photodiodes 10 to minimize crosstalk generated between pixels.

However, in order to implement an image with relatively higher resolution, the photodiodes of the adjacent unit pixels should be closer to each other. Also, the device isolation films may be reduced in width, and thus may end up with unsatisfactory light blocking characteristics. Moreover, according to the related art, the process of forming the device isolation films by burying trenches may be divided into the process of forming the first device isolation film 21 and the process of forming the second device isolation film 23, which may contribute to the cost associated with a relatively high number of processes, which may thereby undesirably minimize production yield.

SUMMARY

In view of the above, the embodiments relate to an image sensor capable of minimizing crosstalk by allowing each of light receiving devices forming a pixel array to have relatively sufficient spaced distance from its adjacent light receiving devices. Embodiments provide a method for manufacturing an image sensor, which may be capable of minimizing crosstalk by allowing each of light receiving devices forming a pixel array to have a relatively sufficient spaced distance from its adjacent light receiving devices.

Embodiments may include at least one of: (1) an image sensor including a semiconductor substrate. (2) A plurality of light receiving devices formed within the semiconductor substrate. (3) A plurality of device isolation films configured to isolate the light receiving devices from each other, wherein when an arrangement direction of a pixel array may be formed by arranging the light receiving devices in a horizontal direction, the pixel array may be formed by alternately arranging a first type light receiving device and a second type light receiving device having different horizontal lengths.

The image sensor may further include plugs configured to be formed on the light receiving devices within the semiconductor substrate, in accordance with embodiments. The image sensor may minimize a difference of signal values by adjusting amplification factors for sensing signals by the first type light receiving device and the second type light receiving device, in accordance with embodiments.

The image sensor may further include a buried light receiving device formed below the second type light receiving device within the semiconductor substrate when the horizontal length of the second type light receiving device may be relatively small compared to the first type light receiving device, in accordance with embodiments.

Further, when a depth direction of the light receiving devices, the arrangement direction of the pixel array and a vertical direction of the light receiving devices may form a Cartesian coordinate system, a vertical length of the second type light receiving device may be substantially the same as or relatively small compared to that of the first type light receiving device.

In embodiments, a method for manufacturing an image sensor may include at least one of: (1) Forming a plurality of device isolation films, which may define active regions, within a semiconductor substrate to have a first spaced distance and a second spaced distance in an alternating manner. (2) Alternately depositing a first type light receiving device having a horizontal length by the first spaced distance and a second type light receiving device having a horizontal length by the second spaced distance within the semiconductor substrate, to thereby form a pixel array by arrangement of the first and second type light receiving devices.

In embodiments, a method may further include forming plugs on the light receiving devices within the semiconductor substrate. In embodiments, a method may include forming a buried light receiving device below the second type light receiving device within the semiconductor substrate where the horizontal length of the second type light receiving device may be relatively small compared to the first type light receiving device.

In embodiments, when a depth direction of the light receiving devices, an arrangement direction of the pixel array and a vertical direction of the light receiving devices form a Cartesian coordinate system, said alternately depositing may form the pixel array such that a vertical length of the second type light receiving device is substantially the same as or relatively small compared to the first type light receiving device.

In accordance with the embodiments, when an arrangement direction of a pixel array formed by arranging light receiving devices is in a horizontal direction, light receiving devices with different horizontal lengths may be alternately disposed to form the pixel array. Accordingly, in embodiments, it may be possible to ensure a sufficient spaced distance between each of the light receiving devices forming the pixel array and its adjacent light receiving devices, thereby minimizing crosstalk.

In embodiments, an amplification factor of sensing values of adjacent pixels may be adjusted or a buried light receiving device may be further disposed so as to implement a layered structure of light receiving devices, resulting in compensation for photo sensitivity.

DRAWINGS

The above and other objects and features of embodiments may become apparent from the following description of embodiments, given in conjunction with the accompanying drawings, in which:

Example FIG. 1 is an arrangement view showing a pixel array structure of an image sensor, in accordance with the related art.

Example FIG. 2 is a cross sectional view taken along the line II-II' of FIG. 1, in accordance with the related art.

Figure 3:
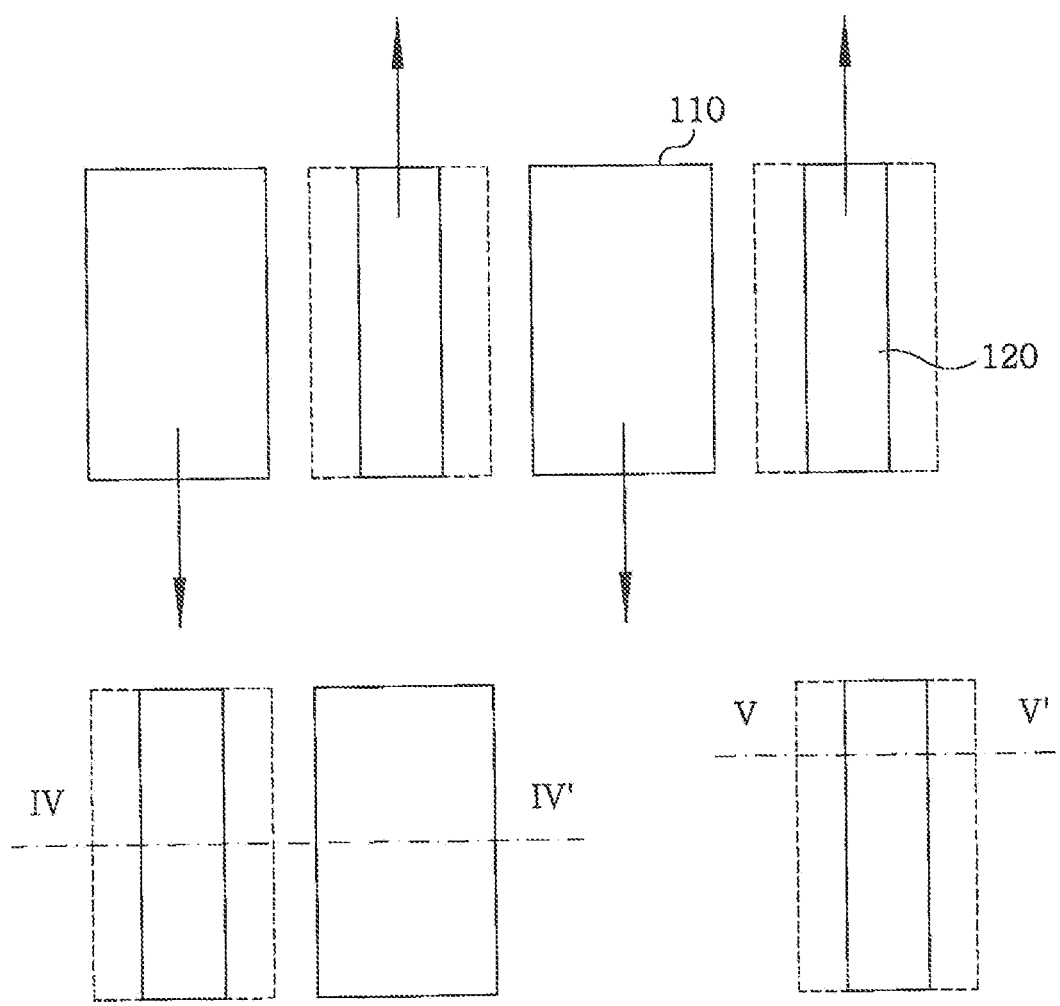

Example FIG. 3 is an arrangement view showing a pixel array striture of an image sensor, in accordance with embodiments.

Figure 4:
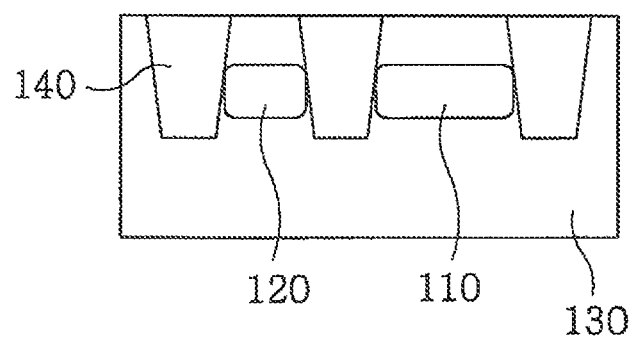
Figure 5:
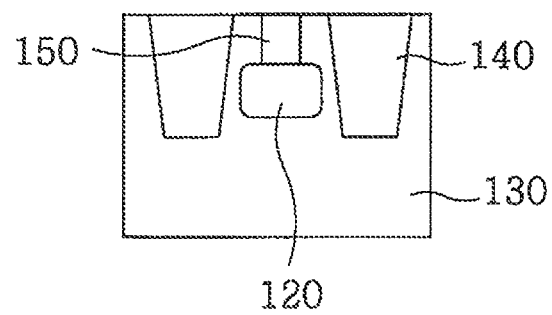

Example FIGS. 4 and 5 are cross sectional views taken along the lines IV-IV' and V-V' of FIG. 3 respectively, in accordance with embodiments.

Figure 6:
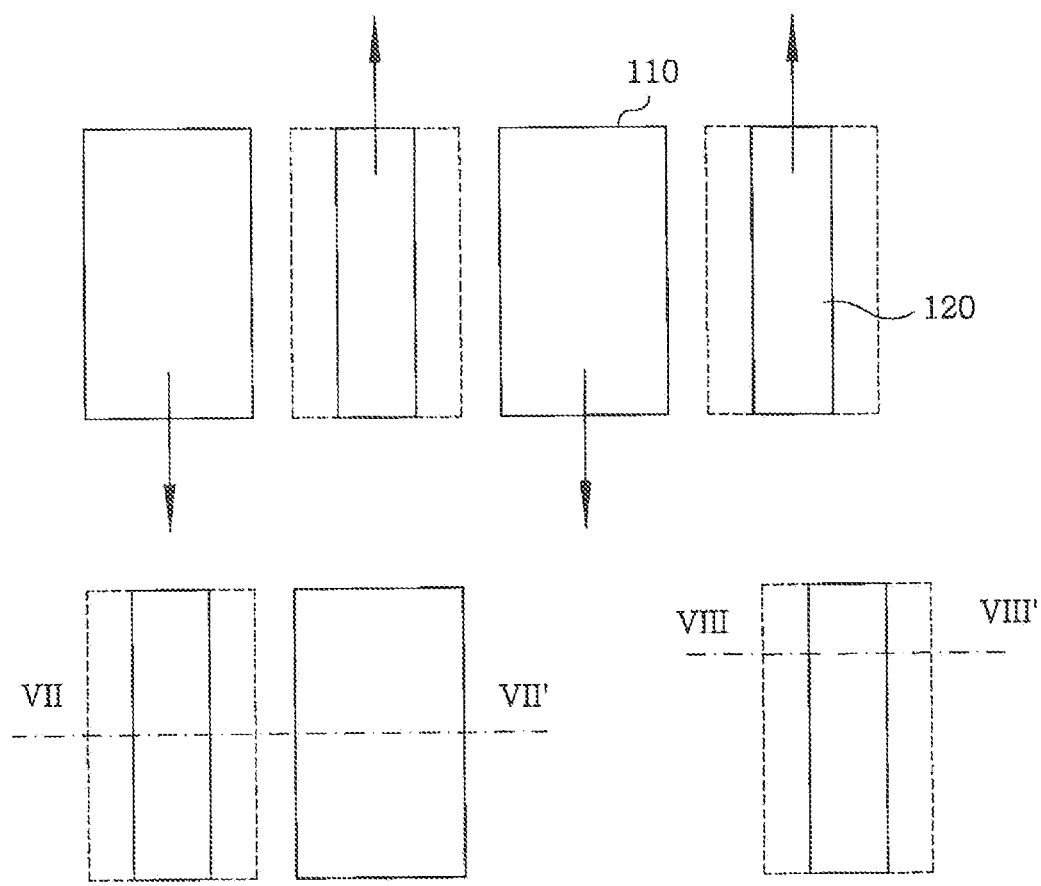

Example FIG. 6 is an arrangement view showing a pixel array structure of an image sensor, in accordance with embodiments.

Figure 7:
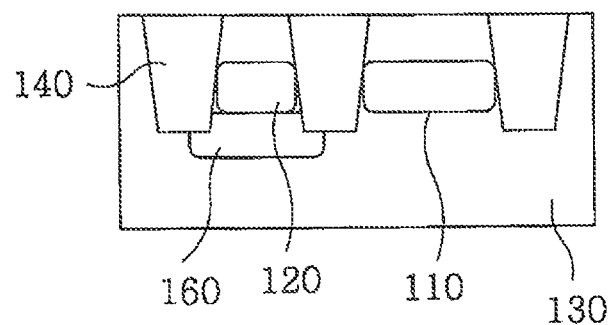
Figure 8:
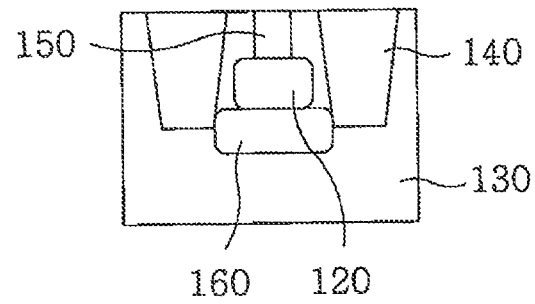

Example FIGS. 7 and 8 are cross sectional views taken along the lines VII-VII' and VIII-VIII' of FIG. 6 respectively, in accordance with embodiments.

Figure 9:
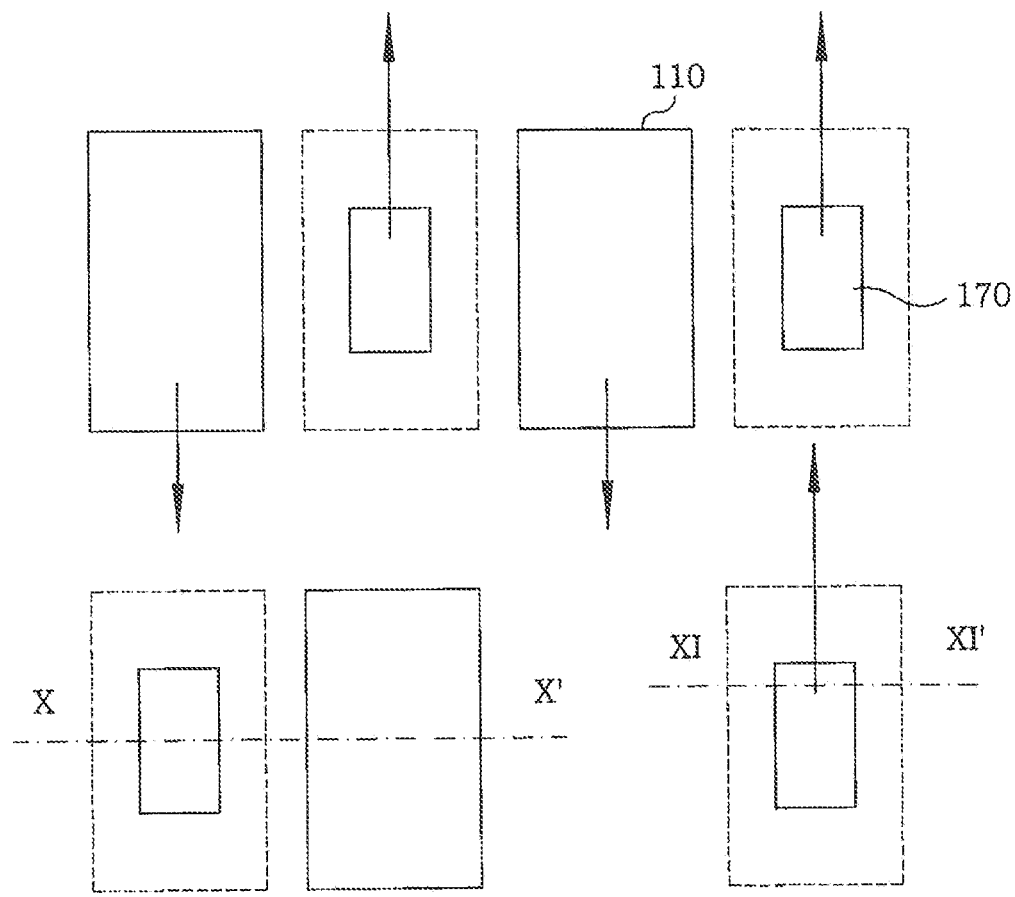

Example FIG. 9 is an arrangement view showing a pixel array structure of an image sensor, in accordance with embodiments.

Figure 10:
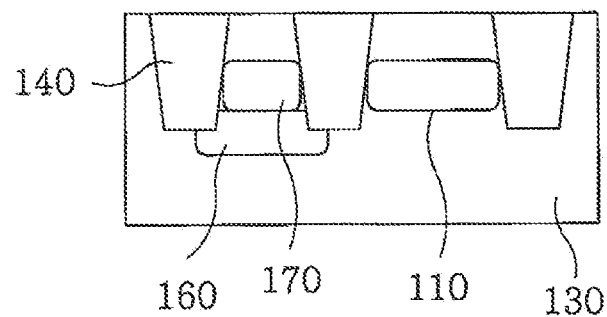
Figure 11:
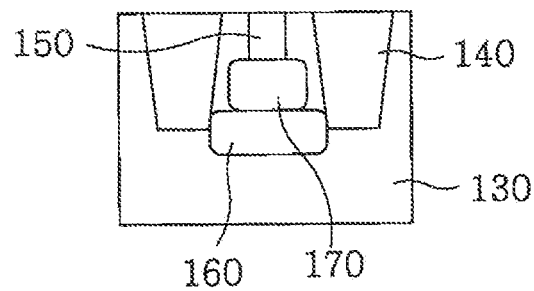

Example FIGS. 10 and 11 are cross sectional views taken along the lines X-X' and XI-XI' of FIG. 9 respectively, in accordance with embodiments.

DESCRIPTION

Example FIG. 3 illustrates an arrangement view showing a pixel array structure of an image sensor, in accordance with embodiments. Example FIGS. 4 and 5 are cross sectional views taken along the lines IV-IV' and V-V' of FIG. 3, respectively, in accordance with embodiments.

As shown in FIGS. 3 to 5, an image sensor may include a semiconductor substrate 130, a plurality of light receiving devices 110 and 120 formed within the semiconductor substrate 130, and a plurality of device isolation films 140 for isolating the light receiving devices 110 and 120 from each other. Assuming that an arrangement direction of a pixel array, which may be formed by arranging the light receiving devices 110 and 120, is in a horizontal direction, the pixel array may be formed by alternately arranging a first type light receiving device 110 and a second type light receiving device 120 having different horizontal lengths. The image sensor may further include plugs 150 formed on the first type light receiving device 110 and the second type light receiving device 120 within the semiconductor substrate 130.

A depth direction of the light receiving devices 110 and 120, the arrangement direction of the pixel array and a vertical direction of the light receiving devices 110 and 120 may form a Cartesian coordinate system, a vertical length of the second type light receiving device 120 may be designed and fabricated to be substantially the same as a vertical length of the first type light receiving device 110. Since a surface area of the second type light receiving device 120 may be relatively small compared to that of the first type light receiving device 110, photo sensitivity by the second type light receiving device 110 may be relatively lower than that of the first type light receiving device 120. To overcome the difference of the photo sensitivity, a difference between signal values may be minimized by adjusting amplification factors of sensing signals by the first and second type light receiving devices 110 and 120. In embodiments, the amplification factor of the sensing signal of the second type light receiving device 120 may be adjusted to be relatively higher such that the sensing signal value by the second type light receiving device 120 can have substantially the same level as the sensing signal value of the first type light receiving device 110.

Hereinafter, a process for fabricating an image sensor in accordance with embodiments will be described. First, a plurality of device isolation films 140, which define active regions, may be formed within the semiconductor substrate 130 to have a first spaced distance and a second spaced distance in an alternating manner. In embodiments, the first spaced distance may decide a horizontal length of a first type light receiving device 110 and the second spaced distance may decide a horizontal length of a second type light receiving device 120 to be formed later.

The device isolation film 140 may be formed by a shallow trench isolation (STI) process or local oxidation of silicon (LOCOS) process. In some cases, it may be formed by forming trenches through an etching process and then burying an insulating material such as a high density plasma (HDP) oxide film or similar.

In embodiments, first type light receiving device 110 and the second type light receiving device 120 may be alternately disposed within the semiconductor substrate 130, thereby forming a pixel array by arrangement. In embodiments, the first type light receiving device 110 may have a horizontal length of the first spaced distance of the device isolation film 140. In embodiments, the second type light receiving device 120 may have the horizontal length of a second spaced distance. In embodiments, when the semiconductor substrate 130 is a P+ conductive type, N+ ions may injected to form the first and second type light receiving devices 110 and 120.

Further, the plugs 150 of the first and second type light receiving devices 110 and 120 may be formed within the semiconductor substrate 130. Since the image sensor in accordance with embodiments may use a structure without a pixel transistor for reading out an image signal at fast speed, the plugs 150 may commonly have a structure for connection to a power distribution network (PDN) junction for each pixel. In such cases, when the semiconductor substrate 130 is a P+ conductive type, N+ ions may be injected to form the plugs 150.

Thereafter, the following processes, such as sequentially forming color filters and a micro lens on and/or over an upper surface of the semiconductor substrate 130, and the like, may be performed to complete the image sensor.

In embodiments, the first and second type light receiving devices 110 and 120 may be designed and fabricated to have different horizontal lengths, and accordingly, a physical length from adjacent pixels may be relatively far compared to that in the related art, thereby minimizing crosstalk.

Example FIG. 6 is an arrangement view showing a pixel array structure of an image sensor, in accordance with embodiments. Example FIGS. 7 and 8 are cross sectional views taken along the lines VII-VII' and VIII-VIII' of FIG. 6, respectively, in accordance with embodiments.

As shown in example FIGS. 6 to 8, an image sensor may include at least one of: (1) A semiconductor substrate 130. (2) A plurality of light receiving devices 110, 120, and 160 formed within the semiconductor substrate 130 to define a pixel array. (3) A plurality of device isolation films 140 for isolating adjacent light receiving devices 110 and 120 from each other in an arrangement direction of the pixel array of the light receiving devices 110, 120, and 160.

Assuming that the arrangement direction of the pixel array may be formed by arranging the light receiving devices 110, 120 and 160 is a horizontal direction, the first and second type light receiving devices 120 with different horizontal lengths may be alternately arranged in the pixel array, in accordance with embodiments. When the horizontal length of the second type light receiving device 120 is relatively short compared to the first type light receiving device 110, a buried light receiving device 160 may be disposed below the second type light receiving device 120 within the semiconductor substrate 130.

In embodiments, an image sensor may further include plugs 150 formed on and/or over the first and second type light receiving devices 110 and 120 within the semiconductor substrate 130.

A depth direction of the light receiving devices 110, 120, and 160 and the arrangement direction of the pixel array and a vertical direction of the light receiving devices 110, 120, and 160 may form a Cartesian coordinate system, in accordance with embodiments. Vertical lengths of the second type light receiving device 120 and the buried light receiving device 160 may be designed and fabricated to be substantially the same as the vertical length of the first type light receiving device 110, in accordance with embodiments.

Since a surface area of the second type light receiving device 120 may be relatively small compared to the first type light receiving device 110, photo sensitivity and saturation voltage of the second type light receiving device 120 may be relatively lower than those of the first type light receiving device 110, in accordance with embodiments. To overcome such differences of the photo sensitivity and the saturation voltage, the buried light receiving device 160 may be used and/or disposed, in accordance with embodiments. In embodiments, the use of the buried light receiving device 160 may result in minimization of the difference between sensing signal values of the second type light receiving device 120 with the buried light receiving device 160 and a sensing signal value of the first type light receiving device 110. In embodiments, the sensing signal values of the second type light receiving device 120 with the buried light receiving device 160 and the sensing signal value of the first type light receiving device 110 may be adjusted to substantially the same level.

Hereinafter, a process for fabricating an image sensor in accordance with embodiments will be described. A plurality of device isolation films 140, which define active regions, may be formed within the semiconductor substrate 130 to have a first spaced distance and a second spaced distance in an alternating manner. In embodiments, the first spaced distance may determine a horizontal length of a first type light receiving device 110 and the second spaced distance may determine a horizontal length of a second type light receiving device 120.

The device isolation film 140 may be formed by an STI process or LOCOS process, in accordance with embodiments. In embodiments, the device isolation film 140 may be formed by forming trenches through an etching process and then burying an insulating material such as an HDP oxide film or similar material. The first type light receiving device 110 having the horizontal length by the first spaced distance of the device isolation film 140 and the second type light receiving device 120 having the horizontal length by the second spaced distance may be alternately disposed within the semiconductor substrate 130. Further, buried light receiving device 160 may be then formed below a light receiving device, which has a relatively shorter horizontal length of the first and second type light receiving devices 110 and 120. In embodiments, when the horizontal length of the second type light receiving device 120 is relatively short compared to the first type light receiving device 110, the buried light receiving device 160 may be disposed below the second type light receiving device 120 within the semiconductor substrate 130.

A pixel array may be formed by arrangement of the first type light receiving devices 110, the second type light receiving devices 120, and the buried light receiving devices 160. In embodiments, when the semiconductor substrate 130 is a P+ conductive type, N+ ions are injected to form the first type light receiving device 110, the second type light receiving device 120, and the buried light receiving device 160. Plugs 150 of the first and second type light receiving devices 110 and 120 may be formed within the semiconductor substrate 130. Since the image sensor in accordance with embodiments uses a structure without a pixel transistor for reading out an image signal at fast speed, the plugs 150 may commonly have a structure for connection to a PDN junction for each pixel. In embodiments, when the semiconductor substrate 130 is a P+ conductive type, N+ ions may be injected to form the plug 150.

Thereafter, the following processes, such as sequentially forming color filters (not shown) and a micro lens (not shown) on and/or over an upper surface of the semiconductor substrate 130, and the like, may be performed to complete the image sensor, in accordance with embodiments. In embodiments, the first and second type light receiving devices 110 and 120 may be designed and fabricated to have different horizontal lengths, and accordingly, a physical length from adjacent pixels may be relatively larger than the related art, thereby minimizing crosstalk.

Example FIG. 9 is an arrangement view showing a pixel array structure of an image sensor in accordance with embodiments. Example FIGS. 10 and 11 are cross sectional views taken along the lines X-X' and XI-XI' of FIG. 9, respectively, in accordance with embodiments.

As shown in example FIGS. 9 to 11, the image sensor may include at least one of: (1) A semiconductor substrate 130. (2)

A plurality of light receiving devices 110, 160, and 170 formed within the semiconductor substrate 130 to define a pixel array. (3) A plurality of device isolation films 140 to isolate adjacent light receiving devices 110 and 170 in an arrangement direction of the pixel array of the light receiving devices 110, 160, and 170.

In embodiments where the arrangement direction of the pixel array may be formed by arranging the light receiving devices 110, 160, and 170 is a horizontal direction, the first and second type light receiving devices 110 and 170 with different horizontal lengths may be alternately arranged in the pixel array. When a horizontal length of the second type light receiving device 170 is relatively short compared to the first type light receiving device 110, a buried light receiving device 160 may be disposed below and/or under the second type light receiving device 170 within the semiconductor substrate 130.

In embodiments, the image sensor may further include plugs 150 formed on the first and second type light receiving devices 110 and 170 within the semiconductor substrate 130. Relative to the depth direction of the light receiving devices 110, 160, and 170, the arrangement direction of the pixel array and a vertical direction of the light receiving devices 110, 160, and 170 may form a Cartesian coordinate system. A vertical length of the second type light receiving device 170 may be designed and fabricated to be relatively short compared to the first type light receiving device 110, in accordance with embodiments. A vertical length of the buried light receiving device 160 may be designed and fabricated to be substantially the same as that of the first type light receiving device 110, in accordance with embodiments.

Since a surface area of the second type light receiving device 170 may be relatively small compared to the first type light receiving device 110, photo sensitivity and saturation voltage of the second type light receiving device 170 may be relatively low compared to the first type light receiving device 110. In embodiments, to overcome such differences of the photo sensitivity and the saturation voltage, a buried light receiving device 160 may be further disposed, which results in minimization of difference between sensing signal values of the second type light receiving device 170 with the buried light receiving device 160 and a sensing signal value of the first type light receiving device 110. In embodiments, the sensing signal values of the second type light receiving device 170 with buried light receiving device 160 and the sensing signal value of the first type light receiving device 110 may be adjusted into substantially the same level.

Embodiments relate to a flexible adjustment of the vertical length of the second type light receiving device 170. For example, in embodiments illustrated in FIG. 2, the vertical length of the second type light receiving device 120 may be designed and fabricated to be relatively short compared to the first type light receiving device 110.

A process for fabricating an image sensor in accordance with embodiments will be described. A plurality of device isolation films 140, which define active regions, may be formed within the semiconductor substrate 130 to have a first spaced distance and a second spaced distance in an alternating manner. In embodiments, the first spaced distance may determine a horizontal length of a first type light receiving device 110 and the second spaced distance may determine a horizontal length of a second type light receiving device 170.

The device isolation film 140 may be formed by an STI process or LOCOS process. In embodiments, it may be formed by forming trenches through an etching process and then burying an insulating material such as an HDP oxide film or the like. The first type light receiving device 110 and the second type light receiving device 170 having a horizontal length by the second spaced distance may be alternately disposed within the semiconductor substrate 130. The first type light receiving device 110 may have a horizontal length that is approximately the first spaced distance of the device isolation film 140. The second type light receiving device 170 may have a horizontal length that is approximately the second spaced distance. In embodiments, when a depth direction of the light receiving devices 110, 160, and 170, the arrangement direction of the pixel array and a vertical direction of the light receiving devices 110, 160, and 170 may form a Cartesian coordinate system. A vertical length of the second type light receiving device 170 may be formed to be relatively short compared to the first type light receiving device 110.

In embodiments, a buried light receiving device 160 may be formed below a light receiving device, which may have the shorter horizontal length than the first and second type light receiving devices 110 and 170. In embodiments, when the horizontal length of the second type light receiving device 170 is relatively short compared to the first type light receiving device 110, the buried light receiving device 160 may be disposed below the second type light receiving device 170 within the semiconductor substrate 130.

In embodiments, a pixel array may be formed by arrangement of the first type light receiving devices 110, the second type light receiving devices 170, and the buried light receiving devices 160. In embodiments, when the semiconductor substrate 130 is a P+ conductive type, N+ ions may be injected to form the first type light receiving device 110, the second type light receiving device 170, and the buried light receiving device 160.

In embodiments, plugs 150 of the first and second type light receiving devices 110 and 170 may be formed within the semiconductor substrate 130. Since the image sensor in accordance with embodiments uses a structure without a pixel transistor for reading out an image signal at fast speed, the plugs 150 may commonly have a structure for connection to a PDN junction for each pixel. In some cases, when the semiconductor substrate 130 is a P+ conductive type, N+ ions may be injected to form the plugs 150.

Processes, such as sequentially forming color filters and a micro lens on and/or over an upper surface of the semiconductor substrate 130, may be performed to complete the image sensor, in accordance with embodiments.

In embodiments, the first and second type light receiving devices 110 and 170 may be designed and fabricated to have different horizontal lengths, and accordingly, a physical length from adjacent pixels may be relatively far compared related art, thereby minimizing crosstalk.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:
1. An image sensor comprising:
a semiconductor substrate;
a plurality of light receiving devices formed within the semiconductor substrate; and
a plurality of device isolation films configured to isolate the plurality of light receiving devices from each other, wherein
the plurality of light receiving devices comprises a plurality of first type light receiving devices and second type light receiving devices, the first type light receiving device and the second type light receiving device have different widths in a horizontal direction, a pixel array is formed by arranging the plurality of light receiving devices in the horizontal direction, the pixel array is formed by alternately arranging the first type light receiving device and the second type light receiving device, and each distance between the plurality of device isolation films respectively corresponds to the widths of the plurality of first type light receiving devices and the widths of the plurality of second type light receiving devices.

2. The image sensor of claim 1, further comprising plugs configured to be formed on the light receiving devices within the semiconductor substrate.

3. The image sensor of claim 1, wherein the image sensor minimizes a difference of signal values by adjusting amplification factors for sensing signals by the first type light receiving device and the second type light receiving device.

4. The image sensor of claim 1, further comprising a buried light receiving device formed at least one of below and under the second type light receiving devices within the semiconductor substrate.

5. The image sensor of claim 1, wherein in a depth direction of the plurality of upper light receiving devices, the arrangement direction of the pixel array and a vertical direction of the light receiving devices form a Cartesian coordinate system.

6. The image sensor of claim 5, wherein a vertical length of the second type light receiving device is substantially the same or shorter than the first type light receiving device.

7. A method for manufacturing an image sensor, the method comprising:

forming a plurality of device isolation films to define active regions in a semiconductor substrate to have a first spaced distance and a second spaced distance in an alternating manner; and alternately depositing a first type light receiving device and a second type light receiving device, wherein the first type light receiving device has a first horizontal length of the first spaced distance within the semiconductor substrate and the second type light receiving device has a second horizontal length of the second spaced distance within the semiconductor substrate to form a pixel array by arrangement of the first and second type light receiving devices, wherein the first horizontal length of the first spaced distance and the second horizontal length of the second spaced distance are different.

8. The method of claim 7, further comprising forming plugs above the light receiving devices within the semiconductor substrate.

9. The method of claim 7, comprising forming a buried light receiving device at least one of below and under the second type light receiving device within the semiconductor substrate when the horizontal length of the second type light receiving device is shorter than the horizontal length of the first type light receiving device.

10. The method of claim 7, wherein with reference to a depth direction of the light receiving devices, an arrangement direction of the pixel array and a vertical direction of the light receiving devices forms a Cartesian coordinate system.

11. The method of claim 10, wherein said alternately depositing form the pixel array such that a vertical length of the second type light receiving device is substantially the same as or relatively shorter than that of the first type light receiving device.

* * * * *